US006972427B2

(12) United States Patent
Roehr et al.

(10) Patent No.: US 6,972,427 B2
(45) Date of Patent: Dec. 6, 2005

(54) SWITCHING DEVICE FOR RECONFIGURABLE INTERCONNECT AND METHOD FOR MAKING THE SAME

(75) Inventors: Thomas Roehr, Aschheim (DE); Thomas D. Happ, Pleasantville, NY (US)

(73) Assignee: Infineon Technologies AG, Munich (DE)

( * ) Notice: Subject to any disclaimer, the term of this patent is extended or adjusted under 35 U.S.C. 154(b) by 2 days.

(21) Appl. No.: 10/834,276

(22) Filed: Apr. 29, 2004

(65) Prior Publication Data

US 2005/0242337 A1 Nov. 3, 2005

(51) Int. Cl.$^7$ .............................................. H01L 29/02
(52) U.S. Cl. .......................... 257/2; 257/762; 365/153; 438/675
(58) Field of Search ............................... 257/4, 529, 1, 257/2, 3, 762; 365/153; 438/130, 131, 132, 438/675

(56) References Cited

U.S. PATENT DOCUMENTS

| | | | | |
|---|---|---|---|---|
| 4,652,894 | A * | 3/1987 | Potember et al. | 257/1 |
| 4,764,415 | A * | 8/1988 | Isoda et al. | 428/212 |
| 6,487,106 | B1 * | 11/2002 | Kozicki | 365/153 |
| 6,614,048 | B2 * | 9/2003 | Leuschner | 257/40 |
| 6,806,511 | B2 * | 10/2004 | Armgarth et al. | 257/197 |
| 6,825,489 | B2 * | 11/2004 | Kozicki | 257/42 |

* cited by examiner

*Primary Examiner*—Sara Crane
(74) *Attorney, Agent, or Firm*—Slater & Matsil, L.L.P.

(57) ABSTRACT

A switching device to be reversibly switched between an electrically isolating off-state and an electrically conducting on-state for use in, e.g., a reconfigurable interconnect. The device includes two separate electrodes, one of which being a reactive metal electrode and the other one being an inert electrode, and a solid state electrolyte arranged between the electrodes and being capable of electrically isolating the electrodes to define the off-state. The reactive metal electrode and the solid state electrolyte also being capable of forming a redox-system having a minimum voltage (turn-on voltage) to start a redox-reaction, which results in generating metal ions that are released into the solid state electrolyte. The metal ions are reduced to increase a metal concentration within the solid state electrolyte, wherein an increase of the metal concentration results in a conductive metallic connection bridging the electrodes to define the on-state.

23 Claims, 8 Drawing Sheets

| INA | INB | XOR |
|---|---|---|
| 0 | 0 | 0 |
| 0 | 1 | 1 |
| 1 | 0 | 1 |
| 1 | 1 | 0 |

SWITCHING DEVICE FOR RECONFIGURABLE INTERCONNECT AND METHOD FOR MAKING THE SAME

BACKGROUND

1. Field of the Invention

The present invention relates to a switching device, which can be reversibly switched between an electrically isolating off-state and an electrically conducting on-state for use in a reconfigurable interconnect, reconfigurable electrical conductor network, reconfigurable integrated circuit, or the like.

2. Background

Reconfigurable logical circuits like field programmable gate arrays (FPGAs) are widely used in today's electronic system design. In contrast to conventional logic implementations, FPGAs offer higher flexibility and allow new product development cycles to be shortened considerably. Currently used re-programmable logic circuits typically use flash memory cells to store the configuration information. A flash memory is a type of FET device, which typically is made of a grid of columns and rows with memory cells, that have two gates at each intersection, a first control gate and a second floating gate, which are separated from each other by a thin oxide layer. In applying an electric field, electrons are able to tunnel to or from the floating gate and such that the threshold voltage of the device can be switched between two states.

Flash memory technology is well established. Disadvantages associated with this technology include long write/erase times, which are typically in the range of milliseconds, and required high write voltages, which typically are in the range of 10 to 13 V, resulting in high programming energy. Further, the flash cell manufacturing process is relatively complex and expensive. Flash memory cells contain a complex floating gate device and require a sense amplifier circuit to provide read out, as well as a microcontroller circuit for programming.

In view of the foregoing, there is a need for an improved switching device.

SUMMARY

An electrical switching device is disclosed that is relatively small in size, easy to manufacture and reliable in use, and does not require high write/erase voltage or high programming energy.

A switching device according to an embodiment of the present invention may be reversibly switched between an electrically isolating off-state and an electrically conducting on-state for use in a reconfigurable interconnect. In an exemplary embodiment, it comprises two separate electrodes, a reactive metal electrode and an inert electrode, for applying a voltage therebetween, as well as a solid state electrolyte (ion conducting electrolyte), arranged between the electrodes, that functions as a host material.

Particularly, a switching device is disclosed that is switchable between an electrically isolating off-state and an electrically conductive on-state. The switching device comprises a reactive metal electrode, an inert electrode, and a solid state electrolyte arranged between the electrodes and being capable of electrically isolating the electrodes to define the off-state. The reactive metal electrode and the solid state electrolyte form a redox-system having a turn-on voltage to start a redox-reaction, where the redox reaction results in generating metal ions to be released into the solid state electrolyte. The metal ions are reduced to increase a metal concentration within the solid state electrolyte, wherein an increase of the metal concentration results in a conductive metallic connection bridging the electrodes to define the on-state.

A process is also disclosed for preparing the switching device in reconfigurable integrated circuits, comprising steps of creating a first metal line/through via opening and depositing the solid state electrolyte, creating a second metal line/through via opening and depositing the reactive metal electrode material, and creating a third metal line/through via opening and depositing the inert electrode material.

Other and further objects, features and advantages of the invention will appear more fully from the following description.

BRIEF DESCRIPTION OF THE DRAWINGS

In the following the invention is explained in more detail with reference to the accompanying figures in which.

DETAILED DESCRIPTION

Embodiments of the present invention will be described in detail below with reference to the accompanying drawings.

Figure 1A:
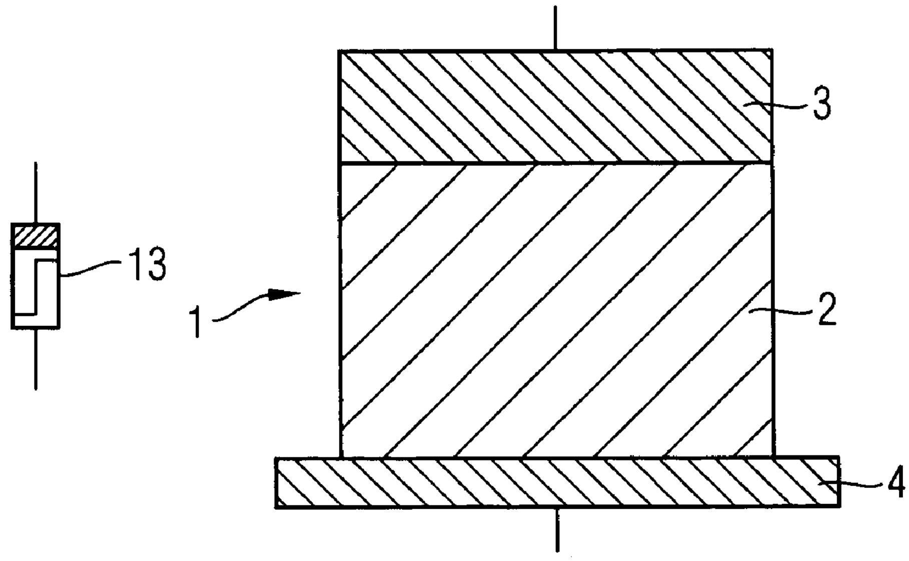
FIGS. 1A–1B are views showing a schematic layout of a switching device according to an embodiment of the invention without (FIG. 1A) and with (FIG. 1B) metal precipitates formed under voltage application.
Figure 1B:
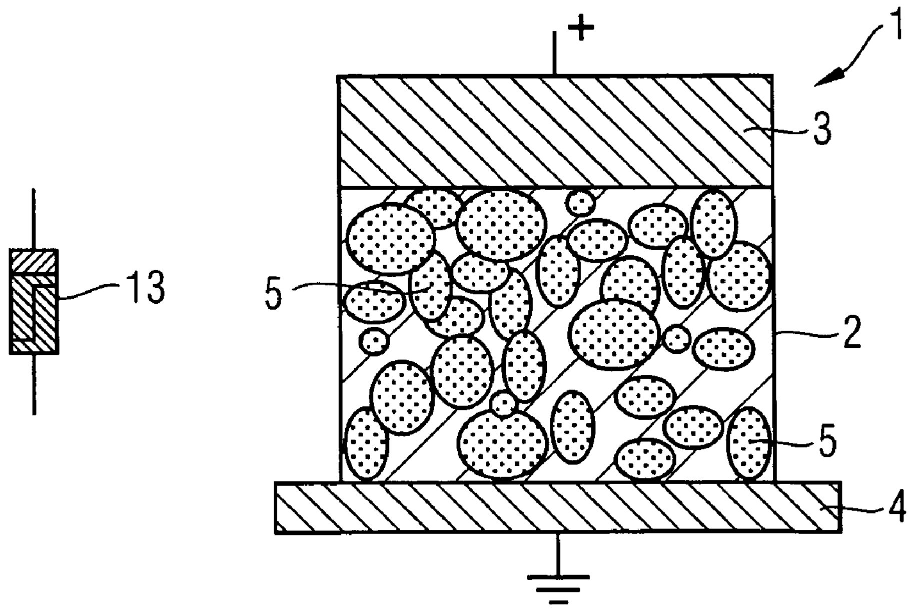

FIGS. 1A–1B show schematic structures of the layout of a switching device according to an embodiment of the switching device of the invention without metal precipitates (FIG. 1A), i.e. non-conductive state of the switching device, and with metal precipitates (FIG. 1B) formed under voltage application, i.e. conductive state of the switching device. A symbolic representation 13 of the switching device in its different switching states is given to the left of each switching device. The switching device 1 comprises a porous solid state electrolyte host material 2, such as a porous chalcogenide glass, for example GeSe or GeS, as well as a reactive metal electrode 3, for example Cu, Ag, Au or Zn, and an inert electrode 4, for example, W, Ti, Ta, TiN, doped Si or Pt. The host material is sandwiched between both electrodes such that the solid state electrolyte 2 and reactive metal electrode 3 together form a redox-system having a well-defined redox potential. In the case where a potential more positive than the redox potential is applied onto the reactive metal electrode 3, redox reaction starts and metal ions depending on the electrode material chosen, for instance $Cu^{++}$-ions or $Ag^{+}$-ions, are driven into the solid state electrolyte host material 2.

In the virgin state, without application of a voltage across the electrodes, which is shown in FIG. 1A, the resistivity of the switching device is very high, since the solid state electrolyte is an excellent isolator. While the solid state electrolyte may be background doped with the same metal as reactive metal electrode 3, this background doping does not negatively affect the isolating characteristic of the solid state electrolyte host material.

FIG. 1B is a schematic view showing the switching device having a voltage applied to its electrodes, such that metal precipitates are forming. As is sketched, under the influence of the applied voltage the redox reaction at the reactive metal electrode 3 drives metal ions into the solid state electrolyte host material 2, which results in the formation of metal precipitates 5, which will grow in number, density and volume to finally bridge both electrodes. As can be seen from FIG. 1B, an anodic potential has to be applied to the reactive metal electrode 3 to release metal ions into the solid state electrolyte host material 2.

Figure 2:
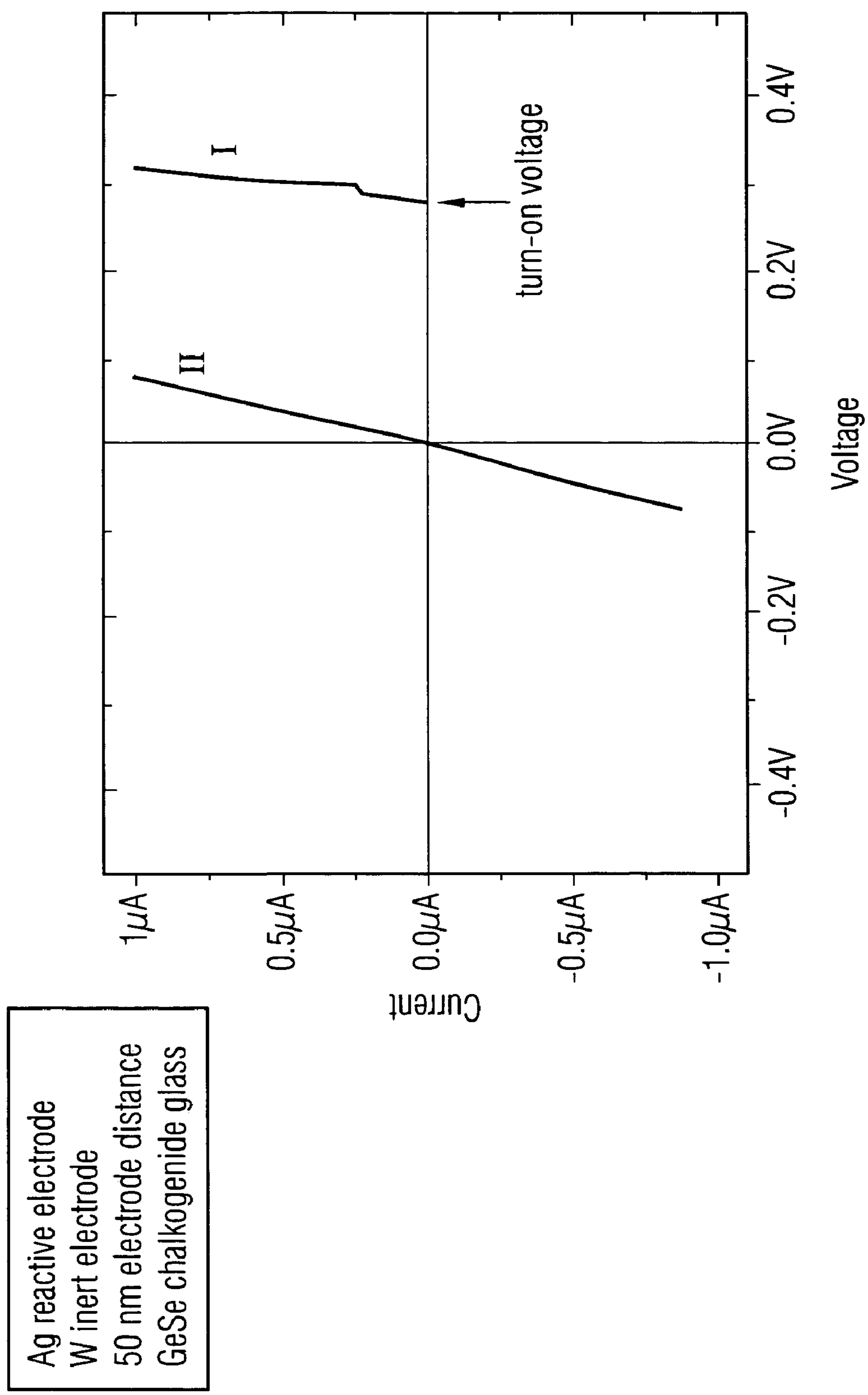
FIG. 2 is a schematic diagram showing a typical switching characteristic of the switching device according to the invention.

FIG. 2 is a schematic diagram showing a typical switching characteristic of the switching device according to the invention. As noted in FIG. 2, the switching device is comprised of a reactive Ag-electrode, an inert W-electrode and a GeSe chalcogenide host material, wherein the electrodes are spaced apart from each other to have a distance of about 50 nm.

Curve I describes a switching characteristic from off to on, which involves an increase of the voltage applied to finally reach turn-on voltage, which approximately amounts to 0.27 V. As can be seen from curve I, no electric current can flow, unless turn-on voltage is reached. After having reached turn-on voltage, electric current can flow, i.e. the switching device has now been switched into its on-state. Curve II shows a current versus voltage characteristic of the switching device in the case where the switching device has been switched into its on-state.

Figure 3:
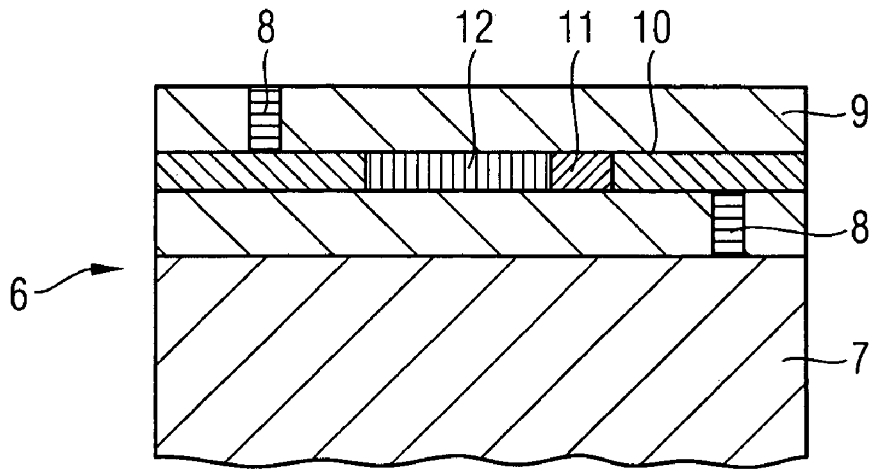
FIG. 3 is a view showing a schematic layout of a first embodiment of a reconfigurable integrated circuit of the invention using a horizontally realized switching device.

FIG. 3 is a view showing a schematic structure according to a first embodiment of the integrated circuit of the invention using a horizontally realized device. In the first embodiment, a switching device according to the invention is integrated in a standard metal line 10 of the integrated circuit on substrate 7. The standard metal line 10 is electrically connected to the integrated circuit by means of through via 8, both of which are embedded in interlayer dielectric 9. The switching device according to the invention comprises a reactive metal electrode 11 and a solid state electrolyte 12, which are integrated in metal line 10. The second electrode, which is preferably an inert electrode, is formed by the metal line itself. In order to prepare the first embodiment of the switching device, an opening in the metal line 10 is created using standard processing techniques, such as lithography, etching, spacer deposition and patterning, chemical-mechanical polishing etc. The metal line opening then is filled with the solid state electrolyte material, which is patterned and refilled with the reactive metal electrode material on one side of the solid state electrolyte.

Figure 4:
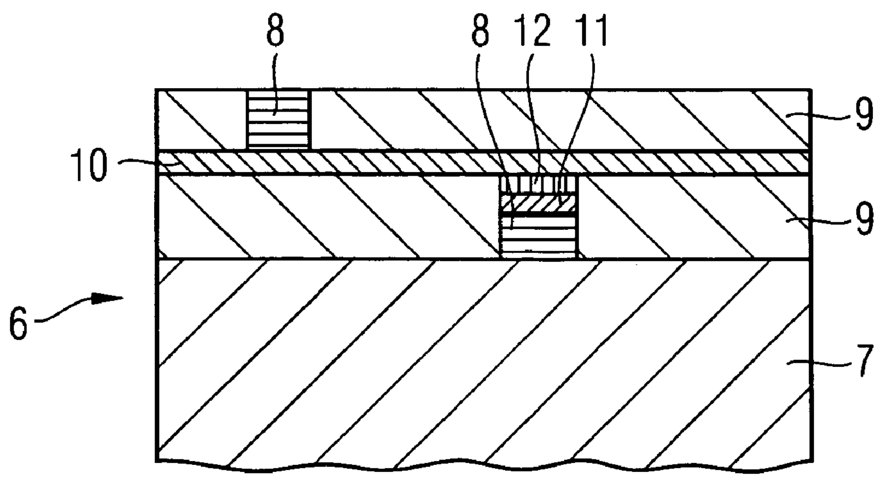
FIG. 4 is a view showing a schematic layout of a second embodiment of the reconfigurable integrated circuit of the invention using a vertically realized switching device.

FIG. 4 is a view showing a schematic structure according to a second embodiment of the integrated circuit of the invention using a vertically realized switching device. In the second embodiment, a switching device according to the invention is integrated in a standard through via 8, connecting the different metallization levels of the integrated circuit. The second embodiment of the switching device comprises a reactive metal electrode 11 and a solid state electrolyte 12, while the second electrode is formed by the metal line 10. In order to prepare the switching device according to the second embodiment of the integrated circuit, an opening in the through via 8 is created using standard processing techniques, which then is filled with the solid state electrolyte material, which latter one then is patterned and refilled with the reactive metal electrode material on one side of the solid state electrolyte. There can also be cap layers/diffusion layers both on top and/or beneath the switching device, depending on the process flow integration requirements.

Figure 5A:
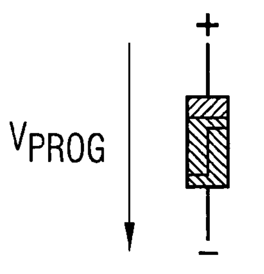
FIGS. 5A–5D show symbolic representations of the invention's switching device in its conductive switching state (FIG. 5A) and in its non-conductive switching state (FIG. 5B) and a circuit diagram of a reconfigurable logic arrangement selectively functioning as inverter or buffer (FIGS. 5C, 5D).
Figure 5B:
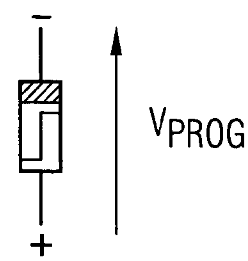

FIGS. 5A–5B show symbolic representations of the switching device according to the invention in its different switching states. The switching device may be switched from its isolating state into its electrically conducting state, after applying a positive write-pulse (FIG. 5A), and it may also be re-switched from its electrically conducting state into its non-conducting state, after applying a negative erase-pulse (FIG. 5B).

Figure 5C:
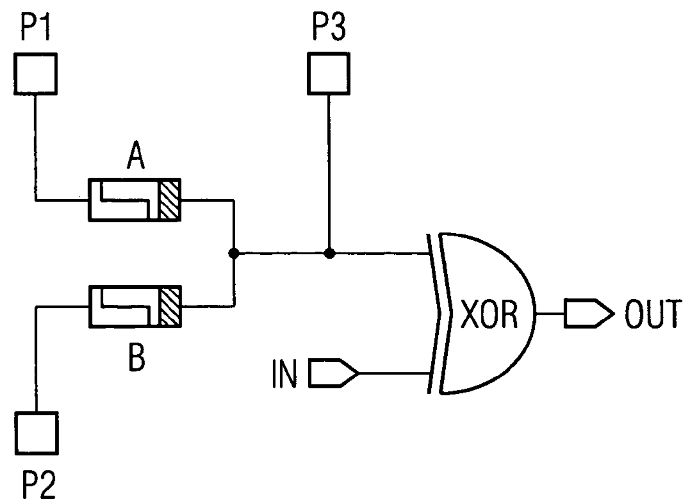
Figure 5D:
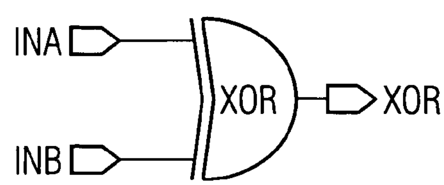
Figures 6A, 6B, 6C, 6D:
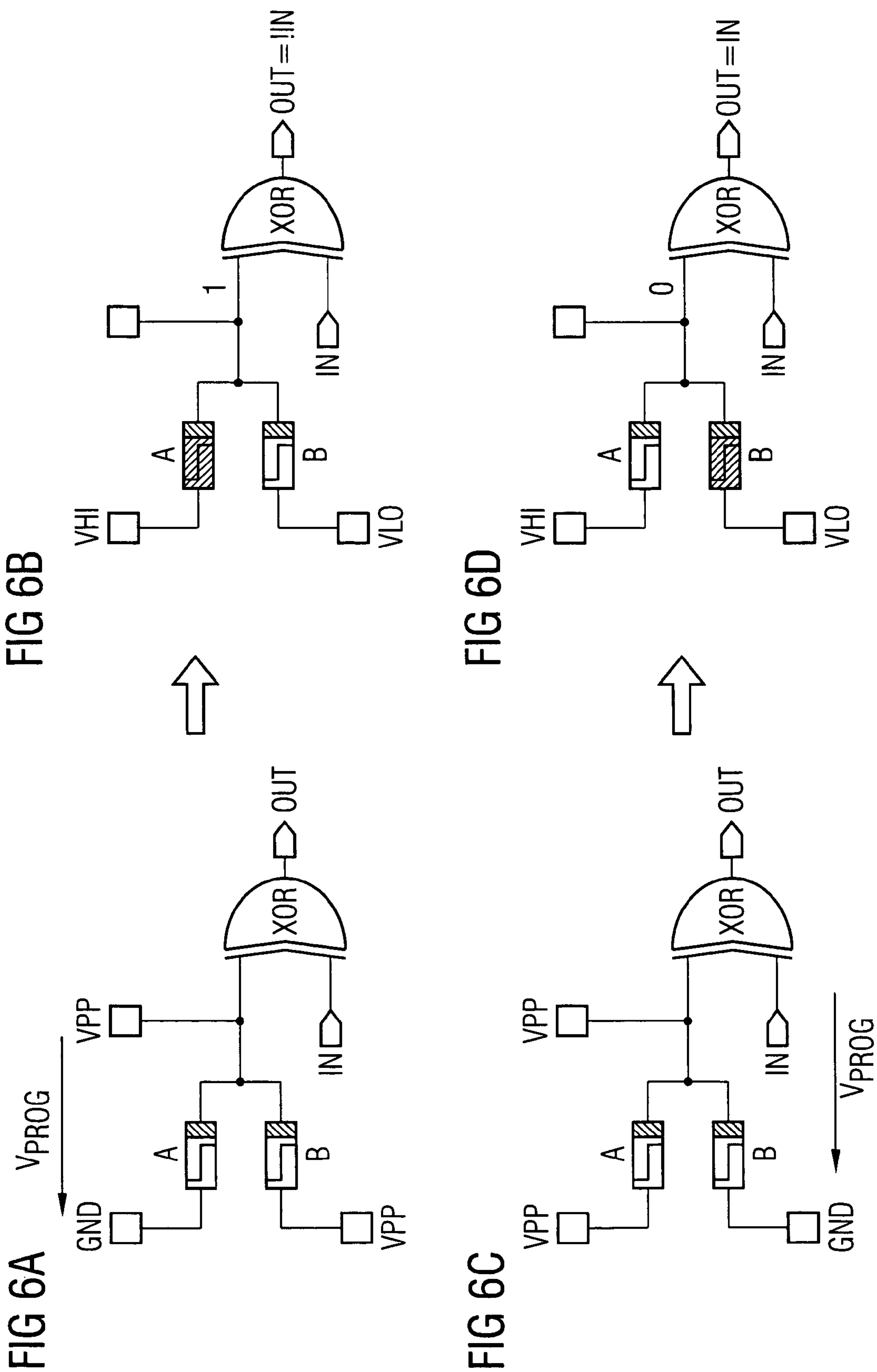
FIGS. 6A–6D show schematically the process of the configuration of the reconfigurable logic arrangement of FIGS. 5A–5D.

FIGS. 5C and 5D show a sample circuit diagram of a reconfigurable logic arrangement selectively functioning as inverter or buffer. The reconfigurable logic arrangement comprises a XOR-gate and two re-programmable switching devices according to the invention. One of the inputs of the XOR-gate, input INA, is connected to the switching devices. As can be seen from the truth table of the used XOR-gate, both inverter and buffer functionality may be realized as to which input has been set to be low or high, i.e. is chosen to be connected to a logical "0" or a logical "1".

As can be seen from FIGS. 6A–6D, by applying a programming voltage (VPP-GND) across switching device A (FIG. 6A), switching device A is switched from its non-conducting state into its electrically conductive state (FIG. 6B), thus realizing an inverter, since input INA of the XOR-Gate is set to a logical "1"(VHI). Alternatively, by applying a programming voltage (VPP-GND) across switching device B (FIG. 6C), switching device B is switched from its non-conducting state into its electrically conductive state (FIG. 6D), thus realizing a buffer functionality, since input INA of the XOR-gate is set to a logical "0" (VLO). Therefore, by programming switching device A, the reconfigurable logical arrangement acts as inverter, and by programming switching device B, the reconfigurable logical arrangement acts as buffer.

Figures 7A, 7B, 7C, 7D:
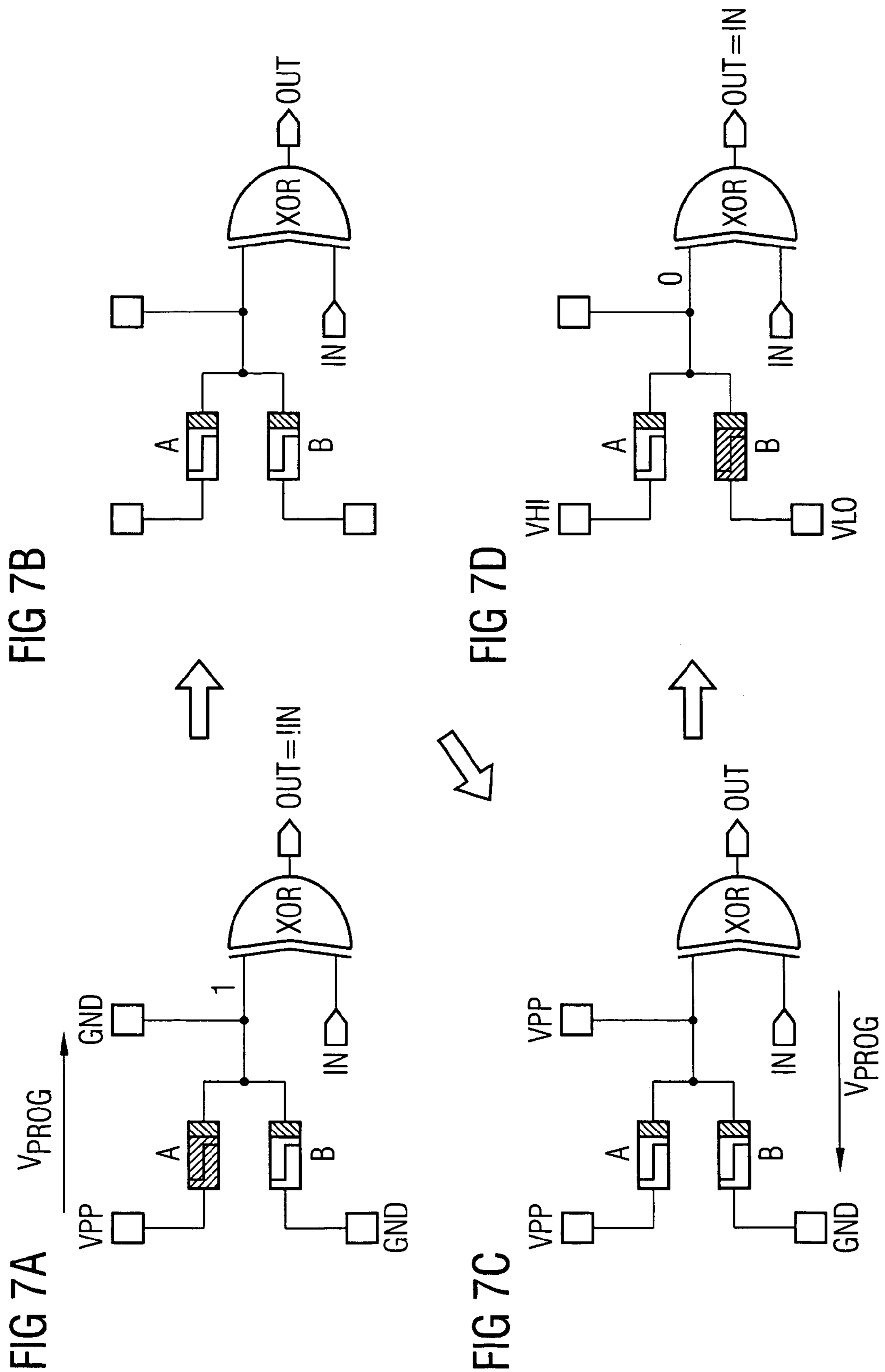
FIGS. 7A–7D show schematically the process of the reconfiguration of the reconfigurable logic arrangement of FIGS. 5A–5D.

As can be seen from FIGS. 7A–7D, by applying a negative voltage pulse (GND-VPP) across switching device A (FIG. 7A), which has been switched into its on-state to realize an inverter functionality, switching device A is switched back into its off-state to reset the logical arrangement into its initial state, in which both switching devices are non-conductive (FIG. 7B). Starting from the initial state of the logical arrangement (FIG. 7B) and applying a positive voltage pulse (VPP-GND) across switching device B, switching device B is switched from its non-conductive state into its conductive state to realize a buffer functionality, since input INA of the XOR-gate is set to a logical "0". Thus the reconfigurable logical arrangement has been transferred from its inverter functionality to its buffer functionality. Analogously, the logical circuit can be reconfigured again to act as an inverter (FIGS. 7C, 7D).

Figure 8:
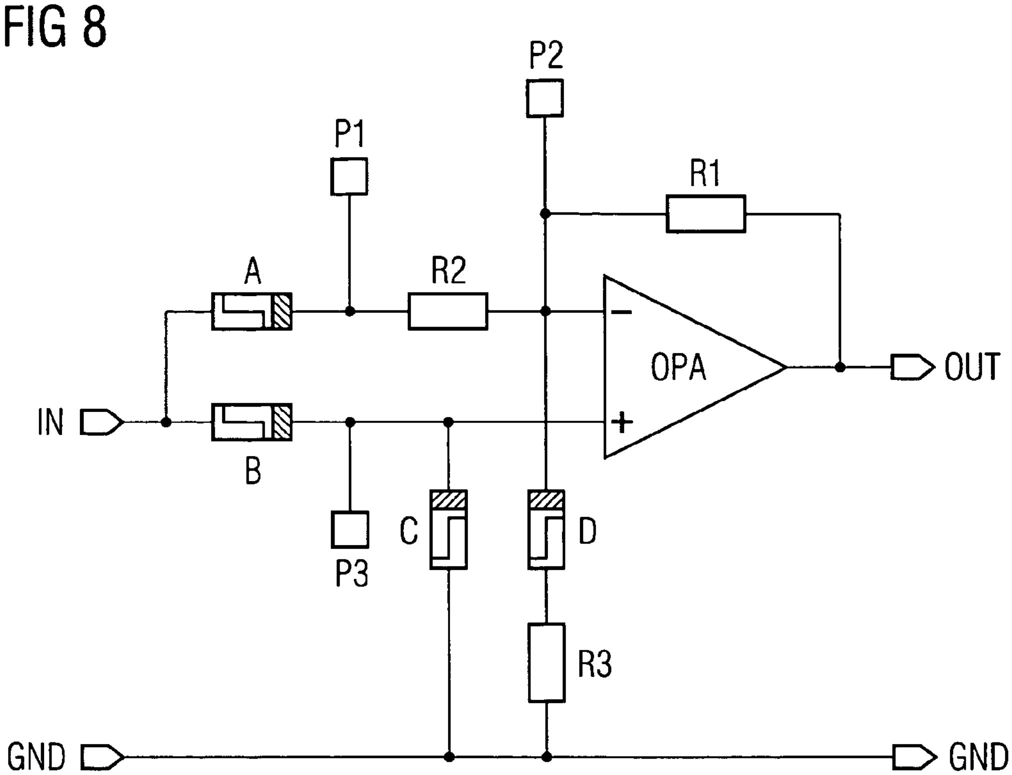
FIG. 8 is a circuit diagram showing an example of a reconfigurable analog arrangement selectively functioning as inverting amplifier or non-inverting amplifier.

FIG. 8 is a circuit diagram showing an example of a reconfigurable analog arrangement selectively functioning as inverting amplifier or non-inverting amplifier. In the arrangement of FIG. 8, an operational amplifier OPA is connected with three resistors R1, R2 and R3, and four switching devices A, B, C and D. Positive or negative voltage pulses may be applied at terminals P1, P2 or P3.

Figure 9A:
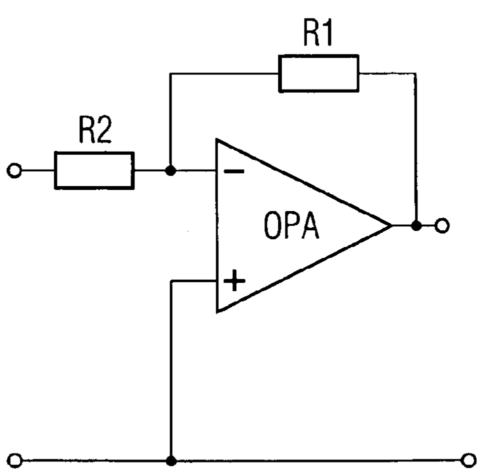
FIGS. 9A–9B are, respectively, a circuit diagram of an inverting amplifier and a non-inverting amplifier.
Figure 9B:
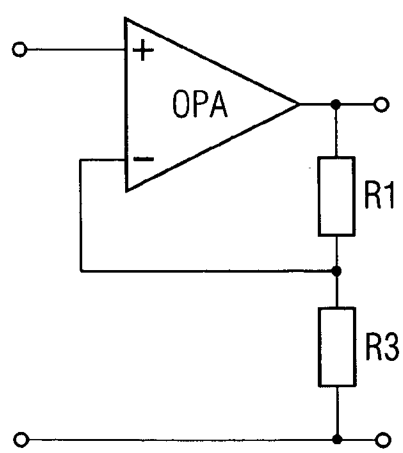

FIGS. 9A–9B show respective circuit diagrams of an inverting amplifier (FIG. 9A) and a non-inverting amplifier (FIG. 9B), devices well-known to those skilled in the art.

Figure 10:
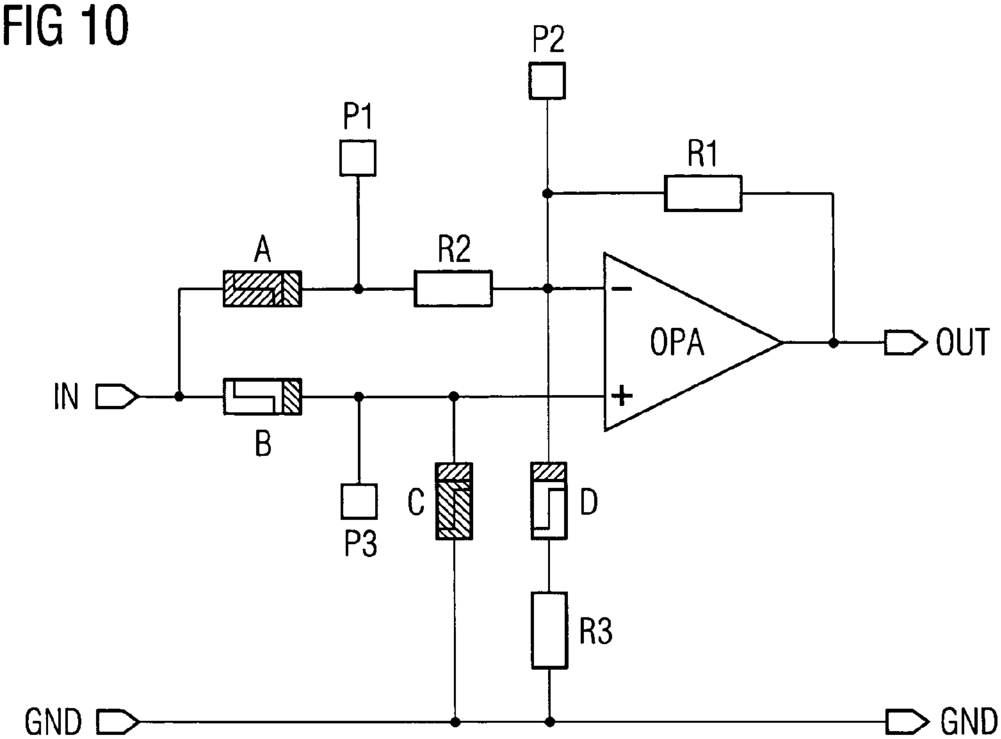
FIG. 10 is a circuit diagram of the reconfigurable analog arrangement of FIG. 8 selectively functioning as inverting amplifier.
Figure 11:
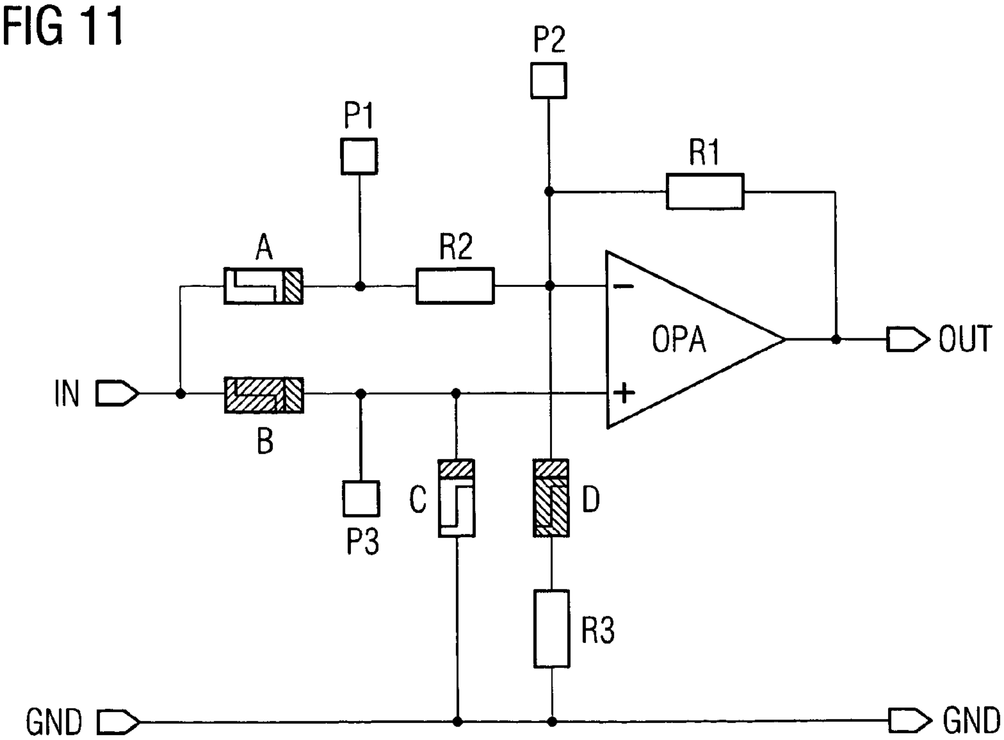
FIG. 11 is a circuit diagram of the reconfigurable analog arrangement of FIG. 8 selectively functioning as non-inverting amplifier.

Starting from the initial state shown in FIG. 8, in which all switching devices are in their non-conductive state, a positive voltage pulse may be applied across switching devices A and C, thus rendering switching devices A and C conductive (FIG. 10). As can be seen from FIG. 9A, an inverting amplifier circuit thus has been realized. Alternatively, by applying a positive voltage pulse across switching devices B and D thus rendering switching devices B and D conductive (FIG. 11), a non-inverting amplifier is realized, as can be seen from FIG. 9B.

In this manner, both amplifier types can be realized with the reconfigurable amplifier circuit shown in FIG. 8. Similarly, as with the previously described logic arrangement, the amplifier circuit can be reconfigured by erasing and reprogramming the switching cells A, B, C and D, such that a non-inverting amplifier is reconfigured to an inverting amplifier, and vice versa.

As will be appreciated by the foregoing, the present invention provides metal-enriched solid state electrolyte switching devices offering a conductive bridging of electrodes, that allows their use as reconfigurable (programmable) conductor elements and configurable conductor networks, integrated circuits or the like. They enable a field programming of circuit connections with unipolar voltage or current pulses. These programming pulses are at a higher amplitude than the desired operating voltage of the circuit, so that disturbance-free operation is ensured. The turn-on voltage (threshold voltage) can be adjusted by tuning of the physical parameters of the switching devices, such as their electrode separation, host material etc. The present invention thus offers an entirely new approach to reconfigure an electrical interconnect in using a switching device as above-described. The switching device according to the invention may be easily manufactured, its switching is realized in a very easy manner by applying voltage to the electrodes, and it is very reliable in use because of its stable metallic bridge made of metallic precipitates between both electrodes.

In accordance with an embodiment of the present invention and in accordance with common understanding in the technical field, an electrically conducting state enables the flow of electrons, which is different from an ion conducting state, as is basically realized in the solid state electrolyte. For this reason, although being ion conducting, the solid state electrolyte is capable of electrically isolating the electrodes to define the off-state of the switching device.

In a preferred embodiment, the solid state electrolyte is arranged between the electrodes (i.e., sandwiched there between), so that the electrodes abut against the solid state electrolyte in order to enable a redox-reaction (reduction-oxidation-reaction) between the reactive metal electrode and the solid state electrolyte which results in the generation of metal ions.

As mentioned above, one of the electrodes is preferably chosen to be a reactive metal electrode, which metal electrode, along with the solid state electrolyte, forms a metal electrode-solid state electrolyte-redox-system having a well-defined redox-potential. When a positive potential is applied to that metal electrode, which potential is chosen to be higher than the redox-potential, the electrode metal is oxidized to reduce metal ions, which are released into the solid state electrolyte. The redox-potential thus defines a minimum voltage which conveniently is designated as a turn-on voltage, to be applied to the electrodes to start the redox-reaction. The turn-on voltage itself depends on a variety of characteristics, including, but not limited to the spatial distance of the electrodes.

A reactive metal electrode (metal ion donor electrode) thus is seen to be capable of supplying metal ions in the case where a voltage higher than the turn-on voltage is applied to the electrodes. Contrary to that, an inert electrode is defined as not being capable of supplying metal ions in the case where the above-characterized turn-on voltage is applied across the electrodes, i.e. an inert electrode is chosen to have a redox-potential, which is higher than that of the reactive metal electrode and further, does not chemically react with the solid state electrolyte.

By applying a voltage across the electrodes that is at least equivalent to the turn-on voltage, anodically produced metal ions are driven into the solid state electrolyte and then will be reduced to form metallic precipitates. A continuous supply of metal ions into the solid state electrolyte will then result in an increase of metal concentration within the solid state electrolyte, such that the metallic precipitates grow in number, density and volume until they finally reach each other, to form a conductive metallic connection bridging the electrodes, to define the on-state of the switching device. Such difference in electric conductivity between the electric conductive on-state and the electrically isolating off-state of the switching device according to the invention usually amounts to several orders of magnitudes. The switching device in accordance with an embodiment of the invention may simply be re-switched from its on-state into its off-state by changing the polarity of the voltage applied to the electrodes, wherein this voltage amounts to the turn-on voltage at the minimum. In other words, a unipolar voltage having the more positive potential connected to the reactive metal electrode is used to switch the switching device into its on-state, while a unipolar voltage having the more positive potential connected to the inert electrode is used to switch the switching device into its off-state.

In accordance with an embodiment of the invention, the inert electrode is considered inert, in the case where its redox-potential is more positive than the potential, which is used to switch the device. It may be preferable, however, that the turn-on voltage of an inert electrode material is above 20 V. As such, the inert material may be chosen from W, Ti, Ta, TiN, doped Si and Pt.

It is preferred that the turn-on voltage for activation of the redox-system, i.e. start of the redox-reaction to produce metal ions at the anodic-side electrode, is at most 20 V. It is even more preferred that the turn-on voltage is at most 10 V, and it is still further preferred that the turn-on voltage is at most 2 V. It is most preferred that the turn-on voltage is below 1 V and, for example, falls in the range of between 200 and 500 mV. The present invention thus offers an advantage over prior art flash memory technology, which typically uses voltage pulses as high as 10 to 13 V for programming.

The reactive metal electrode material may, for instance, be selected from Cu, Ag, Au and Zn. Since the rate of metal ion in-diffusion into the solid state electrolyte is dependent on the applied voltage, the turn-on voltage is preferably chosen carefully. It should be understood that the applied voltage directly scales up with the redox-potential of the redox-partners. The distance between the electrodes determines electric field strength and, therefore, drift velocity of the metal ions in the electric field. If the distance of the electrodes is made smaller (or alternatively applied voltage is enlarged), then the conductive bridge between both electrodes can form faster and thus the switching device can also be switched faster. The amount of metal ions released into the solid state electrolyte, which determines the resistivity of the switching device in its on-state, depends on the current or charge transport through the switching device.

A small electrode distance in the range of from 50 to 100 nm typically may have turn-on voltages in the range of from 0.3 to 1 V.

While, in general, any solid state electrolyte may be envisaged for use in the present invention, it nevertheless may be preferable that the solid state electrolyte is chosen to be a glassy material, which advantageously is a porous chalcogenide glass, such as GeSe, GeS, AgSe or CuS. Further, the solid state electrolyte may advantageously be chosen to be a porous metal oxide, such as $WO_x$ or $Al_2O_3$.

Further, it may be preferable that the solid state electrolyte is doped with at least one metal, which preferably is chosen to be the same metal as the reactive metal electrode material. As a result of background doped metal precipitates, the necessary time to establish a metal reaction to bridge the electrodes by applying a voltage above the turn-on voltage may advantageously be reduced, since only interstitial regions between adjacent doped background metal precipitates need to be filled. Background metal doping of the solid state electrolyte thus makes it possible to reduce the time that it takes to switch the switching device from its off-state into its on-state, and vice versa, i.e. the response time of the switching device. In background doping the host material, care has to be taken to not compromise the isolating capability of the solid state electrolyte.

The electrodes of the switching device according to embodiments of the invention preferably are spaced apart to have a distance which lies in the range of from 10 nm to 250 nm. It is even more preferred that the distance lies between 20 nm to 100 nm, and typically is about 50 nm.

The switching device may be used in a reconfigurable conductor network, which conductor network is comprised of interconnections between elements, for instance input/output ports or sub-circuits, or the like.

Further, the switching device may advantageously be used in a configurable integrated circuit. Such configurable circuit may have at least one metallization having at least one metal line, in which case it may be preferable to integrate at least one of the switching devices in the metal line. The reconfigurable circuit may also comprise at least two different metallizations, wherein the metallizations being connected by at least one through via. In the latter case, it may be preferable to integrate at least one of the switching devices in the through via, which has the advantage, that by controlling the solid state electrolyte thickness a very fine control of the electrode separation and thus the switching voltages of the switching device is easily achieved. Further, the footprint of the switching devices integrated in the through via is very small, allowing a very dense integration. The reactive electrode material can be either placed on the one or the other side of the solid state electrolyte.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A switching device switchable between an electrically isolating off-state and an electrically conductive on-state, comprising:

a reactive metal electrode;

an inert electrode; and a solid state electrolyte arranged between the electrodes and being capable of electrically isolating the electrodes to define the off-state, wherein the reactive metal electrode and the solid state electrolyte forming a redox-system having a turn-on voltage to start a redox-reaction, the redox reaction resulting in generating metal ions to be released into the solid state electrolyte, the metal ions being reduced to increase a metal concentration within the solid state electrolyte, wherein an increase of the metal concentration results in a conductive metallic connection bridging the electrodes to define the on-state.

2. The switching device according to claim 1, wherein the reactive electrode comprises a metallic material having a redox-potential of no more than 2 V.

3. The switching device according to claim 1, wherein the reactive metal electrode comprises a metallic material having a redox-potential in the range of between 200 and 500 mV.

4. The switching device according claim 1, wherein the reactive electrode material is selected from the group consisting of Cu, Ag, Au and Zn.

5. The switching device according to claim 1, wherein the inert electrode material has a redox potential of above 20 V.

6. The switching device according to claim 1, wherein the inert electrode material is selected from the group consisting of W, Ti, Ta, TiN, doped Si and W.

7. The switching device according to claim 1, wherein the solid state electrolyte comprises at least one glassy material.

8. The switching device according to claim 7, wherein the glassy material comprises at least one chalcogenide glass, such as GeSe, GeS, AgSe or CuS.

9. The switching device according to claim 1, wherein the solid state electrolyte comprises at least one porous metal oxide.

10. The switching device according to claim 1, wherein the solid state electrolyte is background doped with at least one metal.

11. The switching device according to claim 10, wherein the metal for background doping is the same as the reactive metal electrode material.

12. The switching device according to claim 1, wherein the electrodes are spaced apart from each other to have a distance in the range of from 10 nm to 250 nm.

13. The switching device according to claim 1, employed in a reconfigurable electrical interconnect.

14. The switching device according to claim 1, employed in a reconfigurable conductor network.

15. The switching device according to claim 14, wherein at least one conductive line connects at least two of the switching devices.

16. The switching device according to claim 1, employed in a reconfigurable integrated circuit.

17. The switching device according to claim 16, further comprising at least one reconfigurable conductor network.

18. The switching device according to claim 16, wherein the reconfigurable integrated circuit comprises at least one metallization having at least one metal line, wherein at least one switching device is integrated in the at least one metal line.

19. The switching device according to claim 18, wherein the metal line material is the same as the reactive metal electrode material.

20. The switching device according to claim 16, wherein the reconfigurable integrated circuit comprises at least two different metallizations, the metallizations being connected by at least one through via, wherein at least one switching device is integrated in the at least one through via.

21. The switching device according to claim 20, wherein the through via material is the same as the reactive metal electrode material.

22. A method of preparing a switching device in a reconfigurable integrated circuit having a metal line, comprising:

creating a first metal line opening;

filling the first metal line opening with a solid state electrolyte;

creating a second metal line opening;

filling the second metal line opening with a reactive metal electrode material;

creating a third metal line opening; and filling the third metal line opening with an inert electrode material.

23. A method of preparing a switching device in a reconfigurable integrated circuit, comprising:

creating a first through via opening;

depositing a solid state electrolyte in the first through via;

creating a second through via opening;

depositing a reactive metal electrode material in the second through via opening;

creating a third through via opening; and depositing an inert electrode material in the third through via opening.

* * * * *